(12) United States Patent
Lai et al.

(10) Patent No.: US 8,247,247 B2
(45) Date of Patent: Aug. 21, 2012

(54) METHOD OF MANUFACTURING LED MODULE

(75) Inventors: Chih-Ming Lai, Miao-Li Hsien (TW); Ying-Chieh Lu, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 157 days.

(21) Appl. No.: 12/860,917

(22) Filed: Aug. 22, 2010

(65) Prior Publication Data
US 2012/0015462 A1  Jan. 19, 2012

(30) Foreign Application Priority Data
Jul. 16, 2010 (TW) .................. 99123372 A

(51) Int. Cl.
  H01L 21/50 (2006.01)
  H01L 21/52 (2006.01)
  H01L 21/56 (2006.01)
  H01L 21/60 (2006.01)
  H01L 33/48 (2010.01)
  H01L 33/62 (2010.01)
  H01L 33/64 (2010.01)

(52) U.S. Cl. .............. 438/26; 438/43; 257/99; 257/100; 257/E21.5; 257/E21.502; 257/E21.506; 257/E21.51; 257/E33.056; 257/E33.057; 257/E33.059

(58) Field of Classification Search .................. 438/26, 438/42, 43; 257/E21.5, E21.502, E21.506, 257/E21.51, 99, 100, E33.056, E33.057, 257/E33.059
See application file for complete search history.

(56) References Cited

U.S. PATENT DOCUMENTS

| | | | | |
|---|---|---|---|---|
| 3,003,933 A * | 10/1961 | Atkinson | ...................... | 205/271 |
| 4,589,962 A * | 5/1986 | Sajja et al. | ...................... | 205/50 |
| 7,119,422 B2 * | 10/2006 | Chin | .............................. | 257/666 |
| 7,709,856 B2 * | 5/2010 | Tsukagoshi | ................... | 257/100 |
| 8,067,782 B2 * | 11/2011 | Chang et al. | ..................... | 257/99 |
| 2005/0236638 A1 * | 10/2005 | Tsukagoshi | ..................... | 257/99 |
| 2007/0215895 A1 * | 9/2007 | Amoh et al. | ..................... | 257/99 |
| 2009/0250709 A1 * | 10/2009 | Chang et al. | ................... | 257/88 |
| 2010/0321941 A1 * | 12/2010 | Sakai et al. | ............. | 362/296.01 |
| 2012/0015462 A1 * | 1/2012 | Lai et al. | ......................... | 438/26 |
| 2012/0074455 A1 * | 3/2012 | Lu et al. | ......................... | 257/99 |

FOREIGN PATENT DOCUMENTS
CN       102339944       * 2/2012
* cited by examiner

*Primary Examiner* — Mary Wilczewski
(74) *Attorney, Agent, or Firm* — Altis Law Group, Inc.

(57) ABSTRACT

A method for manufacturing an LED module, including steps of: providing a heat conductive plate and an LED die, the heat conductive plate defining a concave groove therein; forming an electrode circuit layer on the heat conductive plate around the concave groove; plating one metal layer on a bottom of the concave groove of the heat conductive plate, and plating another metal layer on the LED die; eutectically bonding the metal layer of the heat conducting plate and the metal layer of the LED die together to form into an eutectic layer; forming electrodes on the LED die, and connecting the electrodes with the electrode circuit layer; and encapsulating the LED die in the concave groove.

12 Claims, 9 Drawing Sheets

METHOD OF MANUFACTURING LED MODULE

BACKGROUND

1. Technical Field

The present disclosure relates to a method of manufacturing a light emitting diode (LED) module.

2. Description of Related Art

Presently, LED modules are preferred for use in non-emissive display devices than CCFLs (cold cathode fluorescent lamp) due to their high brightness, long lifespan, and wide color range.

In manufacturing an LED module, most of the methods involve the following steps. Firstly, an LED die is adhered on a printed circuit board (PCB) via a conductive adhesive such as Ag paste. The LED die is then encapsulated by a transparent material. Finally, the printed circuit board is thermally attached to a metal plate. However, there are many interface layers including a substrate of the LED, electrodes, the conductive adhesive, and the PCB, between the LED die and the metal plate, so that a large thermal resistance against heat to be transferred exists between the LED die and the metal plate.

What is needed, therefore, is a new method for manufacturing an LED module which can overcome the limitations described.

DETAILED DESCRIPTION

Figure 2:
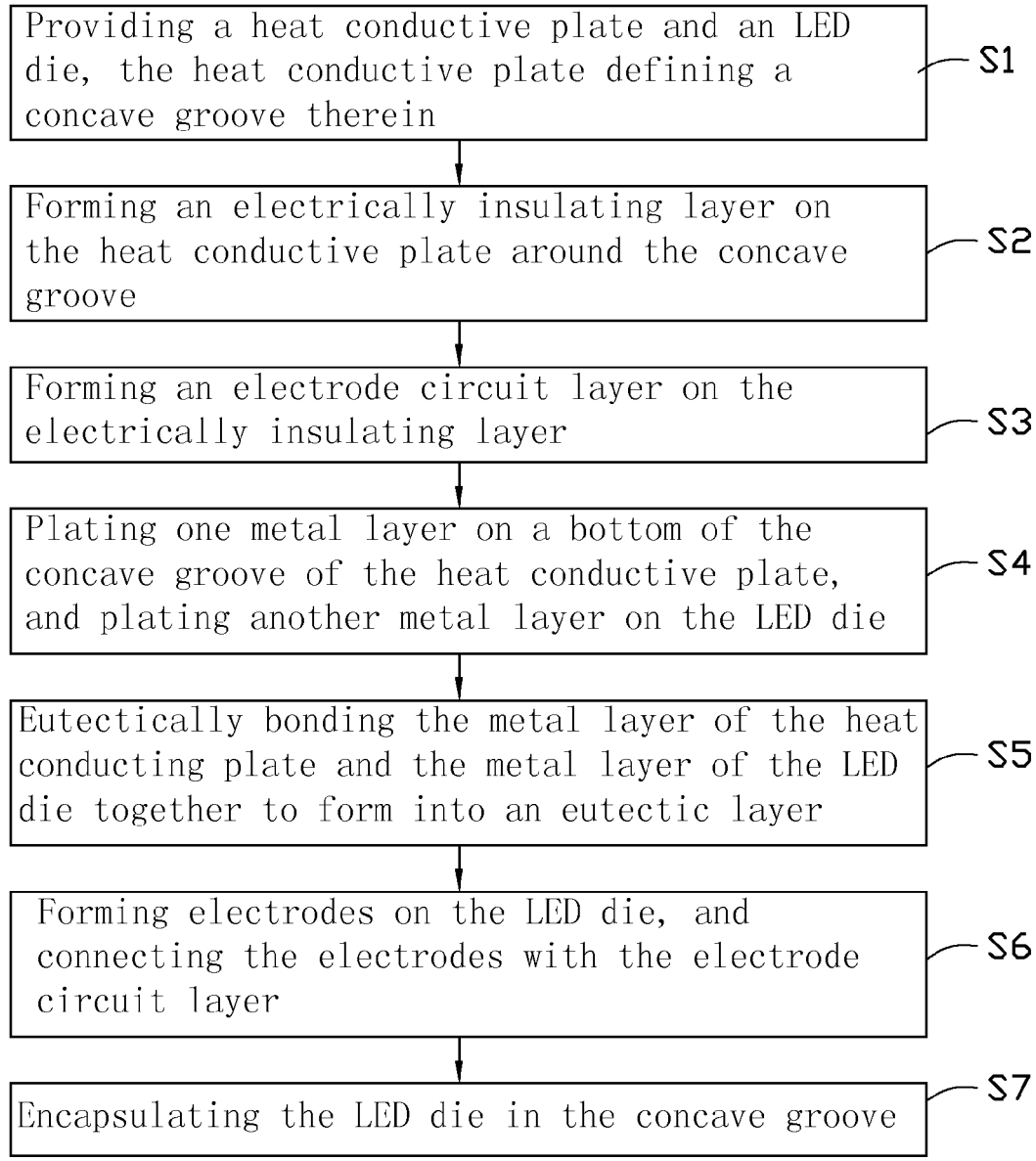
FIG. 2 is a flow chart showing a method for manufacturing the LED module of FIG. 1 in accordance with the first embodiment of the disclosure.

Referring to FIG. 2, a flow chart of a method for manufacturing an LED module in accordance with a first embodiment is shown. The method mainly includes steps of: providing a heat conductive plate and an LED die; forming an electrically insulating layer on the heat conductive plate; forming an electrode circuit layer on the electrically insulating layer; plating a metal layer on the heat conductive plate which is spaced from the electrode circuit layer, and plating another metal layer on the LED die; eutectically bonding the heat conductive plate and the LED die together; forming electrodes on the LED die, and connecting the electrodes with the electrode circuit layer; encapsulating the LED die. All of the steps of the method will be disclosed below in detail.

Figure 3:
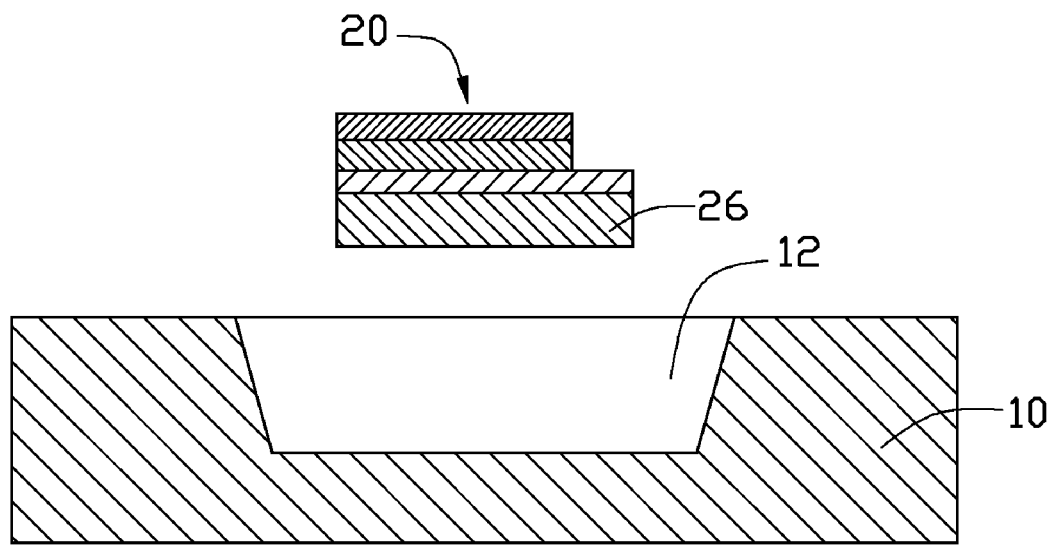
FIGS. 3-8 show various steps in manufacturing the LED module according to the method of FIG. 2.

Referring to FIG. 3, firstly, a heat conductive plate 10 and an LED die 20 are provided in the step S1 of the method. The LED die 20 can be a phosphide represented by general formula $Al_xIn_yGa_{(1-x-y)}P$, here $0 \leq x \leq 1$, $0 \leq y \leq 1$ and $x+y \leq 1$; or an arsenide represented by general formula $Al_xIn_yGa_{(1-x-y)}As$, here $0 \leq x \leq 1$, $0 \leq y \leq 1$ and $x+y \leq 1$. The LED die 20 can also be made of a semiconductor material capable of emitting light of a wavelength which can excite fluorescent material, for example, the LED die 20 can be of an oxide such as ZnO, or a nitride, such as GaN. The LED die 20 is preferably made of a nitride semiconductor material represented by general formula $In_xAl_yGa_{(1-x-y)}N$, here $0 \leq x \leq 1$, $0 \leq y \leq 1$ and $x+y \leq 1$, which can emit light of short wavelengths ranged from ultraviolet light to blue light to excite fluorescent material. The LED die 20 includes a substrate 26 which can be made of an intrinsic semiconductor or an unintentionally doped semiconductor and a light emitting unit (not labeled) formed on the substrate 26. Particularly, the substrate 26 can be of a semiconductor material, such as spinel, SiC, Si, ZnO, GaN, GaAs, GaP or AlN. The substrate 26 can also be of a material with good thermal conductivity but poor electrical conductivity, such as diamond. The carrier concentration of the substrate 26 is preferably $5 \times 10^6$ cm$^{-3}$ or lower, and more preferably $2 \times 10^6$ cm$^{-3}$ or lower, so that the electric current can be electrically insulated from flowing through the substrate 26.

The heat conductive plate 10 has a thermal conductivity larger than 20 W/mK, and can be made of metallic material, such as copper, copper-alloy, aluminum or aluminum-alloy. Alternatively, the heat conductive plate 10 can be of non-metal material, such as silicon. The heat conductive plate 10 is flat and has a coefficient of thermal expansion substantially equal to that of the substrate 26 of the LED die 20. The heat conductive plate 10 defines a concave groove 12 for receiving the LED die 20.

Figure 4:
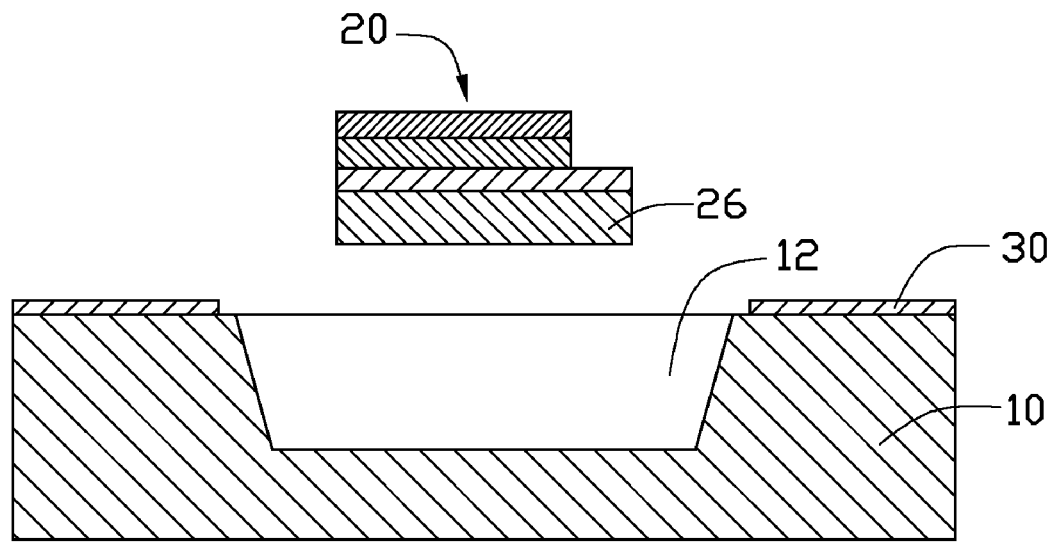

Referring to FIG. 4, an electrically insulating layer 30 is then formed on the heat conductive plate 10 in the step S2 of the method. The electrically insulating layer 30 can be a dielectric layer, a plastic macromolecule layer or a solid flat layer. The dielectric layer can be made of $SiO_2$, $Si_xN_y$, $Si_xO_yN_z$, spin-on glass (SOG), $Al_2O_3$, AlN or $Al_xO_yN_z$. The plastic macromolecule layer can be made of PMMA, polycarbonate (PC), polyethylene terephthalate (PET), epoxy resin or silicone. The solid flat layer can be made of fiberglass or polyimide (PI).

When a Si plate is selected as the heat conductive plate 10 in the first step S1, the electrically insulating layer 30 can be a dielectric layer formed on the heat conductive plate 10 by one of the following methods: 1. oxidating method, i.e., directly oxidizing the Si plate to form a $SiO_2$ layer on the Si plate; 2. nitridizing method, i.e., pouring nitrogen on the Si plate at a high temperature to form a $Si_xN_y$ layer on the Si plate; 3. combining the above two methods to form a $Si_xO_yN_z$ layer; 4. spin coating method, i.e., spreading the Si plate with spin-on glass (SOG) and then heating the Si plate at a suitable temperature to evenly form a $SiO_2$ layer on the Si plate.

When an Al plate is selected as the heat conductive plate 10 in the first step S1, the electrically insulating layer 30 can be a dielectric layer formed on the heat conductive plate 10 by one of the following methods: 1. oxidating method, i.e., directly oxidizing the Al plate to form an $Al_2O_3$ layer on the Al plate; 2. nitridizing method, i.e., pouring nitrogen on the Al plate at a high temperature to form an AlN layer on the Al plate; 3. combining the above two methods to form a compound layer ($Al_xO_yN_z$) containing elements of Al, O and N on the Al plate. In the processes of above methods for forming the electrically insulating layer 30, dissociated air can be poured on the Al plate to form plasma, thereby increasing speed and density of forming the oxide or the nitride.

Figure 5:
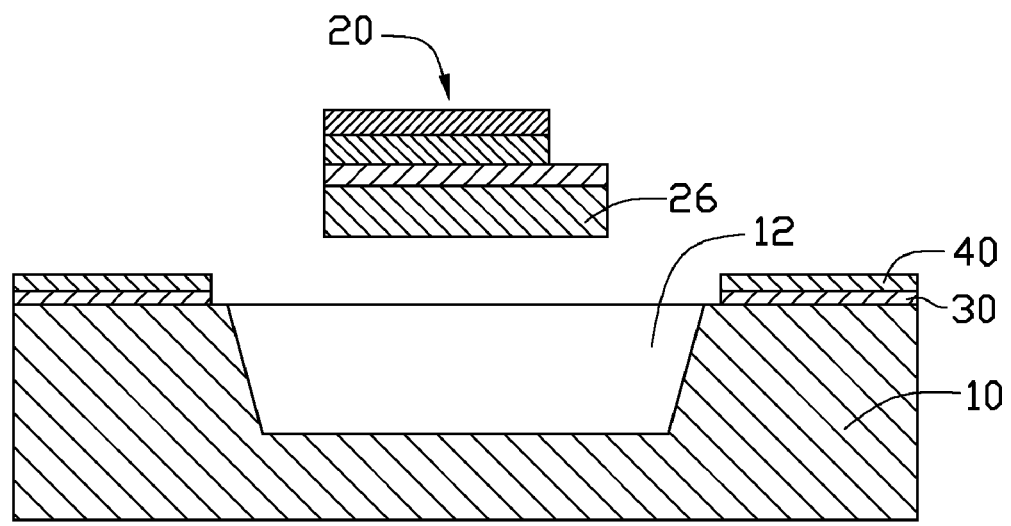

Referring to FIG. 5, an electrode circuit layer 40 is then formed on the electrically insulating layer 30 in the step S3 of the method. The electrode circuit layer 40 can be of at least one selected from Ni, Au, Sn, Be, Al, In, Ti, Ta, Ag, Cu or an alloy thereof. Alternatively, the electrode circuit layer 40 can be of a transparent conducting oxide (TCO), such as Indium Tin Oxides (ITO), Ga-doped ZnO (GZO) or Al-doped ZnO (AZO). The electrode circuit layer 40 can be formed on the electrically insulating layer 30 by physical deposition method, such as sputter, Physical Vapor Deposition (PVD) or e-beam evaporation deposition. The electrode circuit layer 40 can also be formed by chemical deposition method, such as chemical vapor deposition (CVD), electroplating chemical deposition or screen printing.

Figure 6:
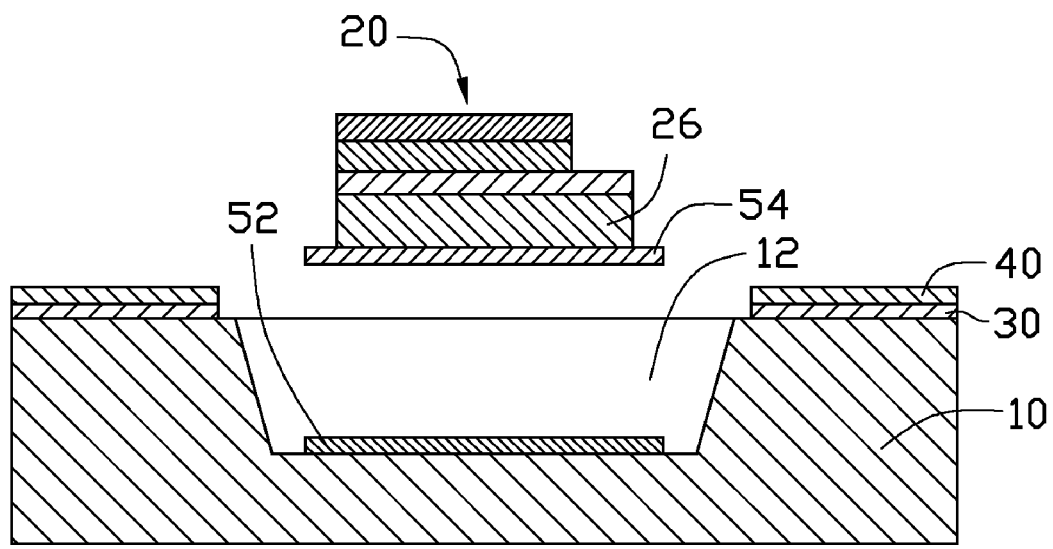

Referring to FIG. 6, a metal layer 52 is then electroplated on an inner face of the groove 12 of the heat conductive plate 10. The metal layer 52 is spaced from the electrode circuit layer 40. Another metal layer 54 is electroplated on a bottom of the substrate 26 of the LED die 20 in the step S4 of the method.

Figure 7:
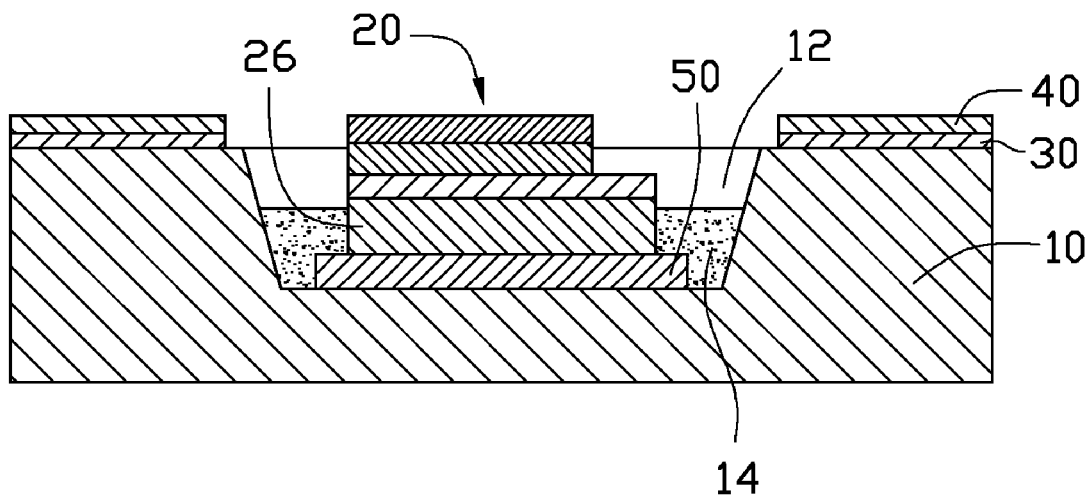

Referring to FIG. 7, the LED die 20 is then received in the groove 12 of the heat conductive plate 10. The metal layer 52 on the heat conducting plate 10 and the metal layer 54 of the LED die 20 are joined together by eutectic bonding to form into an eutectic layer 50 in the step S5 of the method. An electrically insulating heat conduction grease 14 is then filled in a gap of the groove 12 between the heat conductive plate 10 and the LED die 20. The eutectic layer 50 contains at least one selected from Au, Sn, In, Al, Ag, Bi, Be or an alloy thereof.

Figure 8:
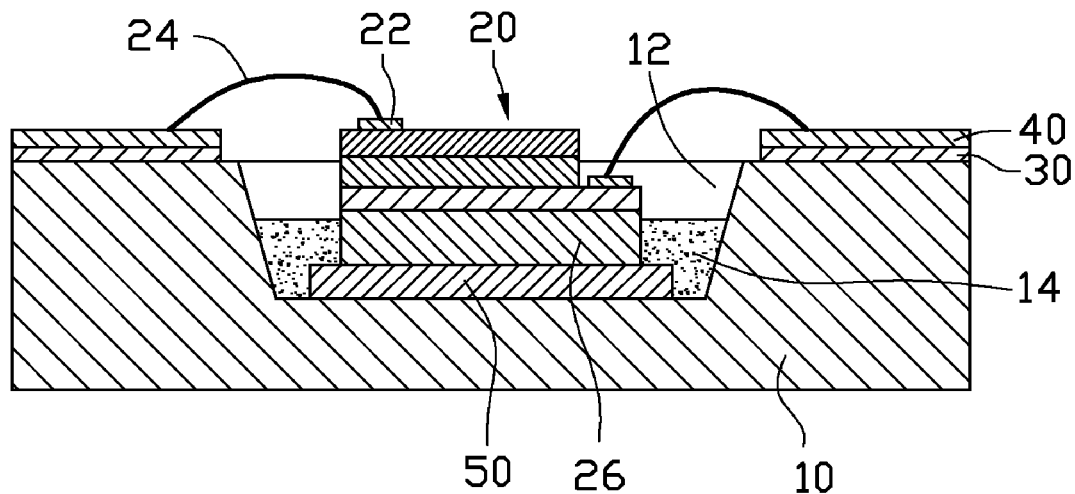

Referring to FIG. 8, electrodes 22 are formed on the LED die 20, and then the electrodes 22 are electrically connected with the electrode circuit layer 40 via metal wires 24 in the step S6 of the method. The metal wires 24 can be made of Au, Sn, In, Al, Ag, Bi, Be or an alloy thereof. This step further includes a test of electrical connection between the electrodes 22, the metal wires 24 and the electrode circuit layer 40, and repairing a broken circuit when it happens.

Figure 1:
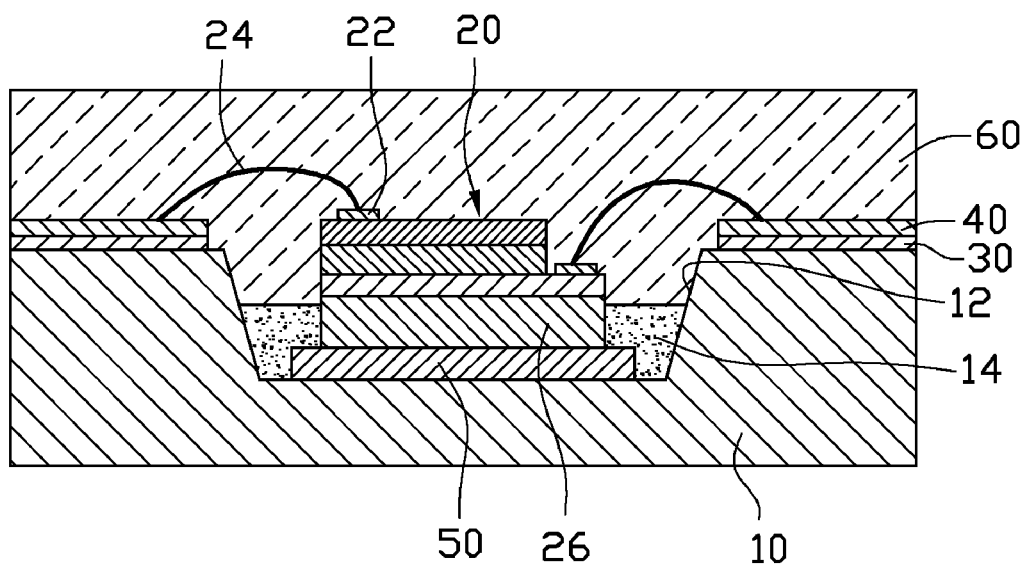
FIG. 1 is a schematic view of an LED module in accordance with a first embodiment of the disclosure.

Referring back to FIG. 1, the LED die 20 is then encapsulated via a transparent encapsulant 60 in the step S7 of the method. The encapsulant 60 can be made of silicone, epoxy resin or PMMA. To convert wavelength of light generated from the LED die 20, a fluorescent material such as sulfides, aluminates, oxides, silicates or nitrides, can be filled and scattered in the encapsulant 60.

Figure 9:
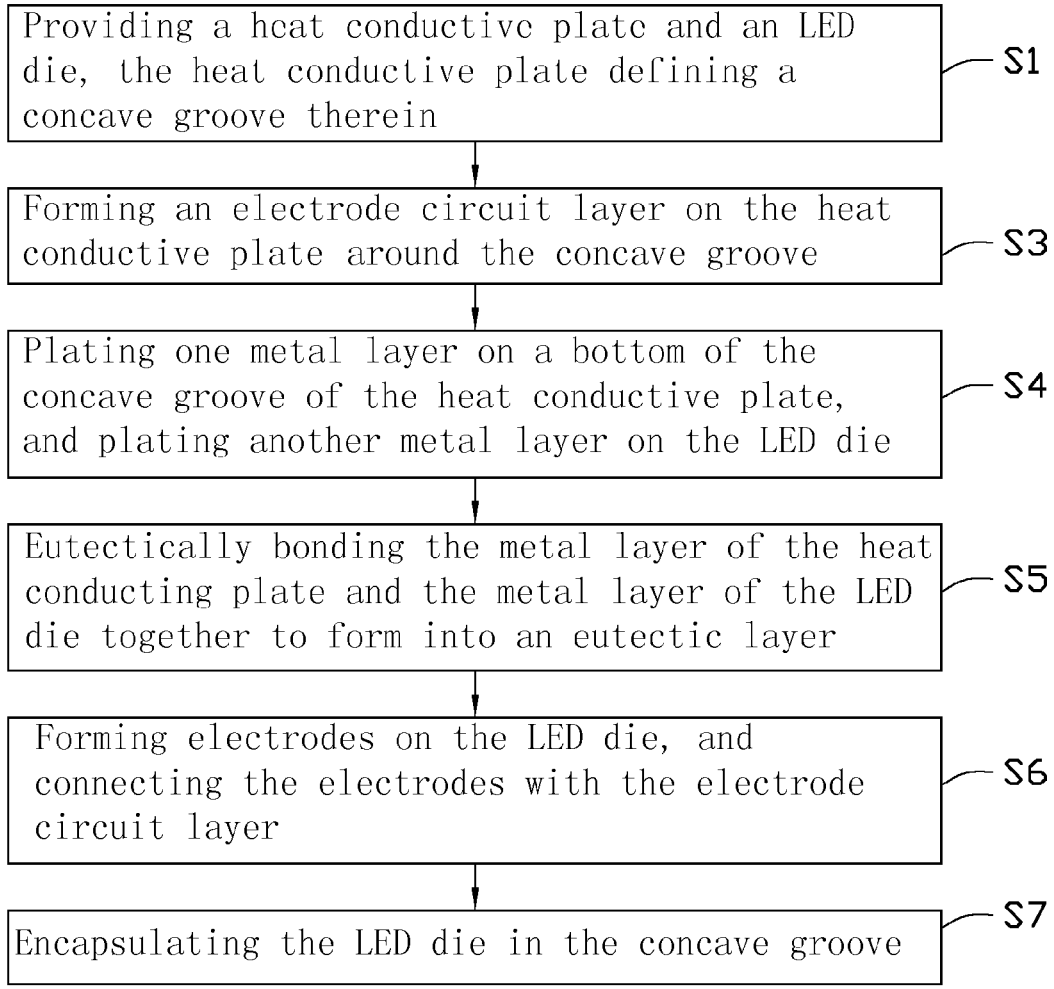
FIG. 9 is a flow chart showing a method for manufacturing the LED module in accordance with a second embodiment of the disclosure.

Referring to FIG. 9, a flow chart of a method for manufacturing an LED module in accordance with a second embodiment is shown. The method of the second embodiment is substantially identical to the method in accordance with the first embodiment of the present disclosure, differing only in the first step S1 and the second step S2. In the first step S1, the heat conductive plate 10 employs a ceramic material with properties of electrically insulating, high thermal conductivity and low coefficient of thermal expansion, such as $Al_xO_y$, AlN or $ZrO_2$, so that the electrode circuit layer 40 can be directly formed on the heat conductive plate 10, thereby omitting the second step S2 of forming the electrically insulating layer 30 on the heat conductive plate 10 as required in the method of the first embodiment.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for manufacturing an LED module, comprising steps of:
    providing a heat conductive plate and an LED die, the heat conductive plate defining a concave groove therein;
    forming an electrically insulating layer on the heat conductive plate;
    forming an electrode circuit layer on the electrically insulating layer around the concave groove;
    plating one metal layer on a bottom of the concave groove of the heat conductive plate, and plating another metal layer on the LED die;
    eutectically bonding the metal layer of the heat conducting plate and the metal layer of the LED die together to form into an eutectic layer;
    forming electrodes on the LED die, and connecting the electrodes with the electrode circuit layer; and
    encapsulating the LED die in the concave groove;
    wherein a Si plate is selected as the heat conductive plate, the electrically insulating layer is formed on the heat conductive plate by one of the following methods: oxidating method, nitridizing method, a combination method of oxidating and nitridazing, and a spin coating method.

2. The method of claim 1, wherein the oxidating method includes directly oxidizing the Si plate to form a $SiO_2$ layer on the Si plate, the nitridizing method includes pouring nitrogen on the Si plate at a high temperature to form a $Si_xN_y$ layer on the Si plate, the combination method including oxidating and nitridizing methods to form a $Si_xO_yN_z$ layer on the Si plate and the spin coating method includes spreading the Si plate with spin-on glass (SOG) and then heating the Si plate at a suitable temperature to evenly form a $SiO_2$ layer on the Si plate.

3. The method of claim 1, wherein the heat conductive plate has a thermal conductivity larger than 20 W/mK.

4. The method of claim 1, wherein the eutectic layer contains at least one selected from Au, Sn, In, Al, Ag, Bi, Be or an alloy thereof.

5. The method of claim 1, wherein the LED die comprises a substrate, the metal layer is formed on the substrate of the LED die.

6. The method of claim 5, wherein the carrier concentration of the substrate is $2 \times 10^6$ $cm^{-3}$ or lower.

7. The method of claim 4, wherein the heat conductive plate has a coefficient of thermal expansion substantially equal to that of the substrate of the LED die.

8. A method for manufacturing an LED module, comprising steps of:
    providing a heat conductive plate and an LED die, the heat conductive plate defining a concave groove therein;
    forming an electrically insulating layer on the heat conductive plate;
    forming an electrode circuit layer on the electrically insulating layer around the concave groove;
    plating one metal layer on a bottom of the concave groove of the heat conductive plate, and plating another metal layer on the LED die;
    eutectically bonding the metal layer of the heat conducting plate and the metal layer of the LED die together to form into an eutectic layer;
    forming electrodes on the LED die, and connecting the electrodes with the electrode circuit layer; and
    encapsulating the LED die in the concave groove;
    wherein an Al plate is selected as the heat conductive plate, the electrically insulating layer is formed on the heat conductive plate by one of the following methods: oxidating method, i.e., directly oxidizing the Al plate to form an $Al_2O_3$ layer on the Al plate; nitridizing method, i.e., pouring nitrogen on the Al plate at a high temperature to form an AlN layer on the Al plate; a combination method of oxidating and nitridizing to form a compound layer ($Al_xO_yN_z$) containing elements of Al, O and N on the Al plate.

9. A method for manufacturing an LED module, comprising steps of:
provaiding a heat conductive plate and an LED die, the heat conductive plate defining a concave groove therein;
forming an electrode circuit layer on the heat conductive plate around the concave groove;
plating one metal layer on a bottom of the concave groove of the heat conductive plate, and plating another metal layer on the LED die;
eutectically bonding the metal layer of the heat conducting plate and the metal layer of the LED die together to form into an eutectic layer;
forming electrodes on the LED die, and connecting the electrodes with the electrode circuit layer; and
encapsulating the LED die in the concave groove;
wherein the heat conductive plate is a ceramic material having electrically insulating property selected from $Al_xO_y$, AlN or $ZrO_2$, and the electrode circuit layer is directly formed on the heat conductive plate.

10. A method for manufacturing an LED module, comprising steps of:
providing a heat conductive plate and an LED die, the heat conductive plate defining a concave groove therein;
forming an electrode circuit layer on the heat conductive plate around the concave groove;
plating one metal layer on a bottom of the concave groove of the heat conductive plate, and plating another metal layer on the LED die;
eutectically bonding the metal layer of the heat conducting plate and the metal layer of the LED die together to form into an eutectic layer;
forming electrodes on the LED die, and connecting the electrodes with the electrode circuit layer;
encapsulating the LED die in the concave groove;
wherein the LED die comprises a substrate, the metal layer is formed on the substrate of the LED die.

11. The method of claim 10, wherein the carrier concentration of the substrate is $2 \times 10^6$ $cm^{-3}$ or lower.

12. The method of claim 10, wherein the heat conductive plate has a coefficient of thermal expansion substantially equal to that of the substrate of the LED die.

* * * * *